US012133332B2

(12) United States Patent
Uhm et al.

(10) Patent No.: US 12,133,332 B2
(45) Date of Patent: Oct. 29, 2024

(54) FLEXIBLE PRINTED CIRCUIT BOARD AND ELECTRONIC DEVICE INCLUDING FLEXIBLE PRINTED CIRCUIT BOARD

(71) Applicant: SAMSUNG ELECTRONICS CO., LTD., Suwon-si (KR)

(72) Inventors: Junwhon Uhm, Suwon-si (KR); Jungkeun Lee, Suwon-si (KR); Hyunmo Yang, Suwon-si (KR); Seungnyun Kim, Suwon-si (KR); Yongsang Yun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 379 days.

(21) Appl. No.: 17/537,295

(22) Filed: Nov. 29, 2021

(65) Prior Publication Data
US 2022/0210922 A1    Jun. 30, 2022

Related U.S. Application Data

(63) Continuation of application No. PCT/KR2021/016480, filed on Nov. 12, 2021.

(30) Foreign Application Priority Data

Dec. 31, 2020  (KR) .......................... 10-2020-0188784

(51) Int. Cl.
*H05K 1/18* (2006.01)
*H05K 1/02* (2006.01)
(Continued)

(52) U.S. Cl.
CPC ............. *H05K 1/189* (2013.01); *H05K 1/028* (2013.01); *H05K 1/118* (2013.01); *H05K 1/148* (2013.01)

(58) Field of Classification Search
CPC ........... G02B 2027/0178; H05K 1/028; H05K 1/118; H05K 1/148; H05K 1/189
See application file for complete search history.

(56) References Cited

U.S. PATENT DOCUMENTS 5,117,282 A     5/1992  Salatino
2005/0276547 A1* 12/2005 Wang ..................... H05K 1/147
                                                      385/88

(Continued)

FOREIGN PATENT DOCUMENTS

EP        0 001 555 A1    5/1979
KR    10-2012-0137474    12/2012
KR    10-2022-0088043     6/2022

OTHER PUBLICATIONS

Extended European Search Report dated Apr. 30, 2024 for EP Application No. 21915502.5.

*Primary Examiner* — Nathan Milakovich
(74) *Attorney, Agent, or Firm* — Nixon & Vanderhye P.C.

(57) ABSTRACT

An electronic device according to an embodiment includes: a housing including a frame, a first temple connected to one side of the frame, and a second temple connected to the other side of the frame, a first printed circuit board (PCB) positioned in the first temple, and a flexible printed circuit board electrically connected to the first PCB, and the flexible printed circuit board includes a first rigid portion connected to the first PCB, a first flexible portion extending from the first rigid portion in a first direction, and a second flexible portion extending from the first rigid portion in a second direction different from the first direction, the second flexible portion being bent in a first bending area to overlap at least a portion of the first flexible portion.

20 Claims, 12 Drawing Sheets

(51) Int. Cl.
*H05K 1/11* (2006.01)
*H05K 1/14* (2006.01)

(56) References Cited

U.S. PATENT DOCUMENTS

| | | | |
|---|---|---|---|
| 2010/0331060 A1* | 12/2010 | Yoshida | H01R 35/00 |
| | | | 174/254 |
| 2011/0228490 A1* | 9/2011 | Kim | H05K 3/323 |
| | | | 361/749 |
| 2012/0293470 A1 | 11/2012 | Nakata | |
| 2017/0104906 A1* | 4/2017 | Tang | H05K 1/148 |
| 2019/0212566 A1 | 7/2019 | Lee et al. | |
| 2020/0379264 A1 | 12/2020 | Terashima | |
| 2020/0393685 A1* | 12/2020 | Isaacs | G02B 27/0176 |
| 2021/0045244 A1 | 2/2021 | McMorrow et al. | |
| 2021/0124175 A1 | 4/2021 | Lee et al. | |
| 2022/0011565 A1* | 1/2022 | Zhang | H04N 23/57 |
| 2022/0155617 A1 | 5/2022 | De Smet et al. | |
| 2022/0197028 A1 | 6/2022 | Choi et al. | |
| 2023/0171911 A1* | 6/2023 | Maggi | H01L 23/13 |
| | | | 361/752 |

* cited by examiner

FLEXIBLE PRINTED CIRCUIT BOARD AND ELECTRONIC DEVICE INCLUDING FLEXIBLE PRINTED CIRCUIT BOARD

CROSS-REFERENCE TO RELATED APPLICATIONS

This application is a continuation of International Application No. PCT/KR2021/016480 designating the United States, filed on Nov. 12, 2021, in the Korean Intellectual Property Receiving Office and claiming priority to Korean Patent Application No. 10-2020-0188784, filed on Dec. 31, 2020, in the Korean Intellectual Property Office, the disclosures of which are incorporated by reference herein in their entireties.

BACKGROUND

Field

The disclosure relates to a flexible printed circuit board and an electronic device including the flexible printed circuit board.

Description of Related Art

An electronic device, which is worn on the head of a user and is capable of directly displaying an image in front of the eyes of the user, has been being developed. For example, a head mounted display (HMD) may display virtual reality content or augmented reality content in front of the eyes of the user so that the user feels as if the user is present in virtual reality or augmented reality. An electronic device that is wearable on the head of the user may have a form of goggles or a form of glasses.

The electronic device that is wearable on the head of the user may include various components required to provide content to the user and electrical components for driving the components. For example, the electronic device may include a printed circuit board (PCB) for controlling components.

The electronic device may include a housing having a structure that is wearable on the head of the user. Components included in the electronic device wearable on the head of the user may be disposed in the housing. If the electronic device is heavy or has a large size, the wearing comfort of the electronic device may be deteriorated. In particular, for a glasses-type electronic device that has a relatively limited area within the housing, various components may not be included due to a lack of a mounting area.

SUMMARY

Embodiments of the disclosure provide an electronic device capable of including a miniaturized printed circuit board and having an increased degree of freedom for a mounting area of the printed circuit board.

Embodiments of the disclosure provide an electronic device that is miniaturized and having increased wearing comfort.

Embodiments of the disclosure provide a flexible printed circuit board capable of being mounted in a narrow space.

According to an example embodiment of the present disclosure, there is provided an electronic device including: a housing including a frame, a first temple connected to one side of the frame, and a second temple connected to another side of the frame; a first printed circuit board (PCB) positioned in the first temple; and a flexible printed circuit board electrically connected to the first PCB, the flexible printed circuit board including a first rigid portion connected to the first PCB, a first flexible portion extending from the first rigid portion in a first direction, and a second flexible portion extending the first rigid portion in a second direction different from the first direction, and bent in a first bending area to overlap at least a portion of the first flexible portion.

According to example embodiment of the present disclosure, there is provided a flexible printed circuit board including: a first rigid portion, a first flexible portion extending from the first rigid portion in a first direction; and a second flexible portion extending from the first rigid portion in a second direction different from the first direction, and bent in a first bending area to overlap at least a portion of the first flexible portion.

According to various example embodiments, the electronic device may miniaturize a printed circuit board and increase a degree of freedom for a mounting area of the printed circuit board, by reducing the space of the connecting portion (e.g., a connector) for connection to other components on the printed circuit board.

Furthermore, according to various example embodiments, the electronic device may be miniaturized, and the wearing comfort of the electronic device may be increased.

Furthermore, according to various example embodiments, the size of the flexible printed circuit board may be reduced, and the flexible printed circuit board may be mounted in a narrow space.

Besides, various effects may be provided that are directly or indirectly identified through the present disclosure.

BRIEF DESCRIPTION OF THE DRAWINGS

The above and other aspects, features and advantages of certain embodiments of the present disclosure will be more apparent from the following detailed description, taken in conjunction with the accompanying drawings, in which.

With respect to the description of the drawings, the same or similar reference signs may be used for the same or similar elements.

DETAILED DESCRIPTION

Hereinafter, various example embodiments disclosed in the present disclosure will be described with reference to the accompanying drawings. However, this is not intended to limit the present disclosure to the specific embodiments, and it is to be construed to include various modifications, equivalents, and/or alternatives of embodiments of the present disclosure.

Figure 1:
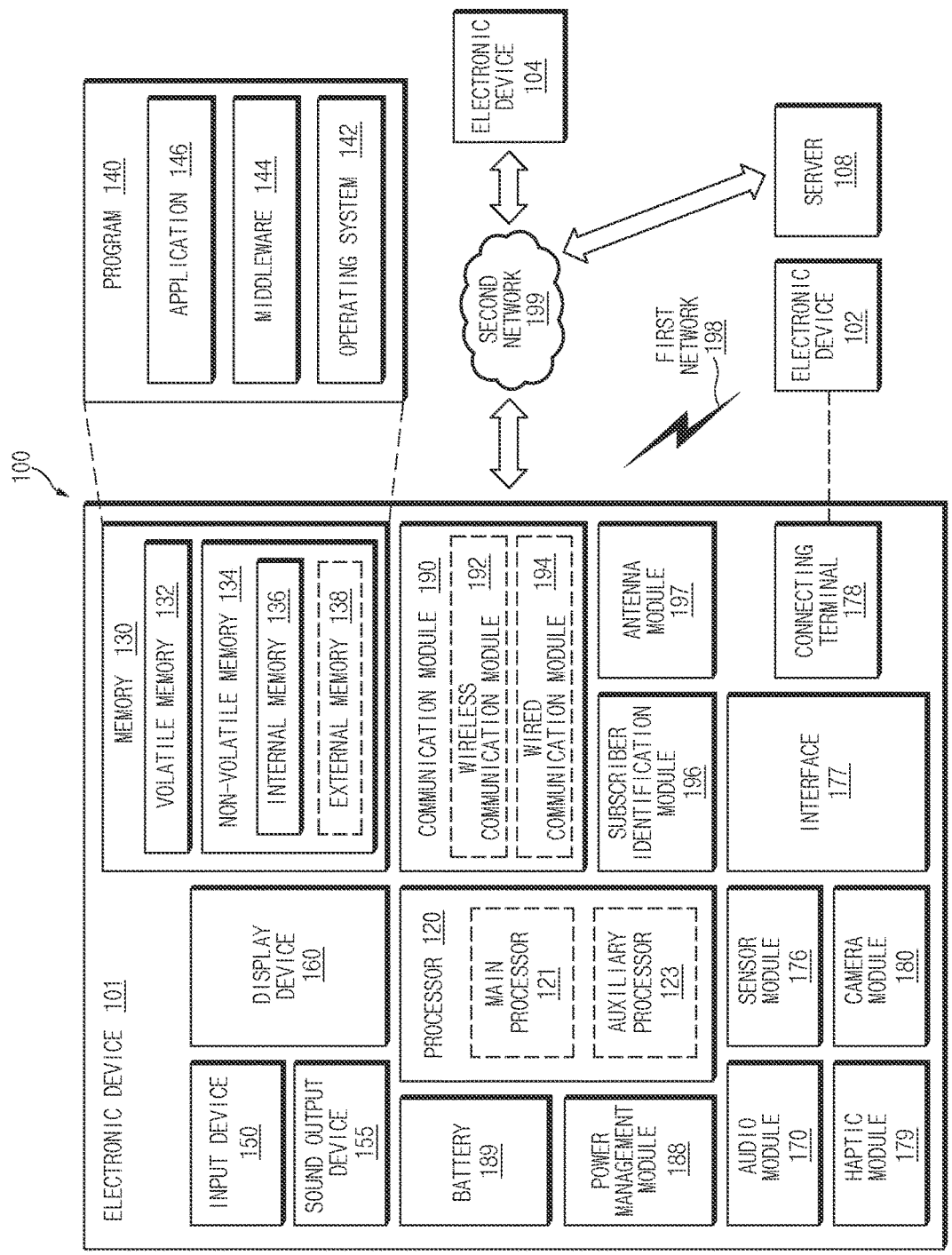
FIG. 1 is a block diagram illustrating an example electronic device in a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one (e.g., the connecting terminal 178) of the components may be omitted from the electronic device 101, or one or more other components may be added in the electronic device 101. In various embodiments, some (e.g., the sensor module 176, the camera module 180, or the antenna module 197) of the components may be integrated into one component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from a different component (e.g., the sensor module 176 or the communication module 190) in a volatile memory 132, process the command or the data stored in the volatile memory 132, and store resulting data in a non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with the main processor 121. For example, when the electronic device 101 includes the main processor 121 and the auxiliary processor 123, the auxiliary processor 123 may be configured to use less power than the main processor 121 or to be specialized for a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application), for example. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., a neural network processing device) may include a hardware structure specialized for processing an artificial intelligence model. The artificial intelligence model may be generated through machine learning. Such learning may be performed, for example, in the electronic device 101 itself on which artificial intelligence is performed, or may be performed through a separate server (e.g., the server 108). The learning algorithm may include, for example, supervised learning, unsupervised learning, semi-supervised learning, or reinforcement learning, but is not limited to the above-mentioned examples. The artificial intelligence model may include a plurality of artificial neural network layers. The artificial neural network may be one of a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-networks, or a combination of two or more of the above networks, but is not limited to the above examples. The artificial intelligence model may additionally or alternatively include a software structure, in addition to the hardware structure.

The memory 130 may store various data to be used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by a component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or may output the sound via the sound output module 155 or an external electronic device (e.g., the electronic device 102) (e.g., a speaker or a headphone) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with an external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

The connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell that is not rechargeable, a secondary cell that is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GLASS) communication module) or a wired communication module 194 (e.g., a local area network (LAN) communication module or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be integrated into a single component (e.g., a single chip), or may be implemented as multi-components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network after a 4G network and a next-generation communication technology, for example, a new radio access technology (NR). NR access technology may support a high-speed transmission of high-capacity data (enhanced mobile broadband (eMBB)), minimization of terminal power and access to multiple terminals (massive machine type communications (mMTC)), or high reliability and low latency (ultra-reliable and low-latency communications (URLLC)). The wireless communication module 192 may support a high frequency band (e.g., mmWave band) to achieve a high data rate, for example. The wireless communication module 192 may support various techniques for securing performance in a high frequency band, for example, beamforming, massive multiple-input and multiple-output (MIMO), full dimensional MIMO (FD-MIMO), array antenna, analog beamforming, or large scale antenna. The wireless communication module 192 may support various requirements defined in the electronic device 101, an external electronic device (e.g., the electronic device 104), or a network system (e.g., the second network 199). According to an embodiment, the wireless communication module 192 may support a peak data rate (e.g., 20 Gbps or more) for achieving the eMBB, loss coverage (e.g., 164 dB or less) for achieving the mMTC, or U-plane latency (e.g., 0.5 ms or less each for downlink (DL) and uplink (UL), or 1 ms or less for the round trip) for achieving the URLLC.

The antenna module 197 may transmit or receive a signal or power to or from the outside (e.g., an external electronic device) of the electronic device 101. According to an embodiment, the antenna module 197 may include an antenna including a radiating element including a conductive material or a conductive pattern formed in or on a substrate (e.g., PCB). According to an embodiment, the antenna module 197 may include a plurality of antennas (e.g., an antenna array). In such a case, at least one antenna appropriate for a communication scheme used in the communication network, such as the first network 198 or the second network 199, may be selected from among the plurality of antennas, for example, by the communication module 190. The signal or the power may then be transmitted or received between the communication module 190 and the external electronic device via the selected at least one antenna. According to various embodiments, another component (e.g., a radio frequency integrated circuit (RFIC)) other than the radiating element may be additionally formed as a part of the antenna module 197.

According to various embodiments, the antenna module 197 may form an mmWave antenna module. According to an embodiment, the mmWave antenna module may include a printed circuit board, an RFIC disposed on or adjacent to a first surface (e.g., bottom surface) of the printed circuit board and capable of supporting a specified high frequency band (e.g., mmWave band), and a plurality of antennas (e.g., an array antenna) disposed on or adjacent to a second surface (e.g., top or side surface) of the printed circuit board and capable of transmitting or receiving signals of the designated high frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To this end, a cloud computing, distributed computing, mobile edge computing (MEC), or client-server computing technology may be used, for example. The electronic device 101 may provide an ultra-low latency service using, for example, distributed computing or mobile edge computing. In an embodiment, the external electronic device 104 may include an Internet of things (IoT) device. The server 108 may be an intelligent server using machine learning and/or neural networks. According to an embodiment, the external electronic device 104 or the server 108 may be included in the second network 199. The electronic device 101 may be applied to an intelligent service (e.g., smart home, smart city, smart car, or health care) based on 5G communication technology and IoT-related technology.

Figure 2:
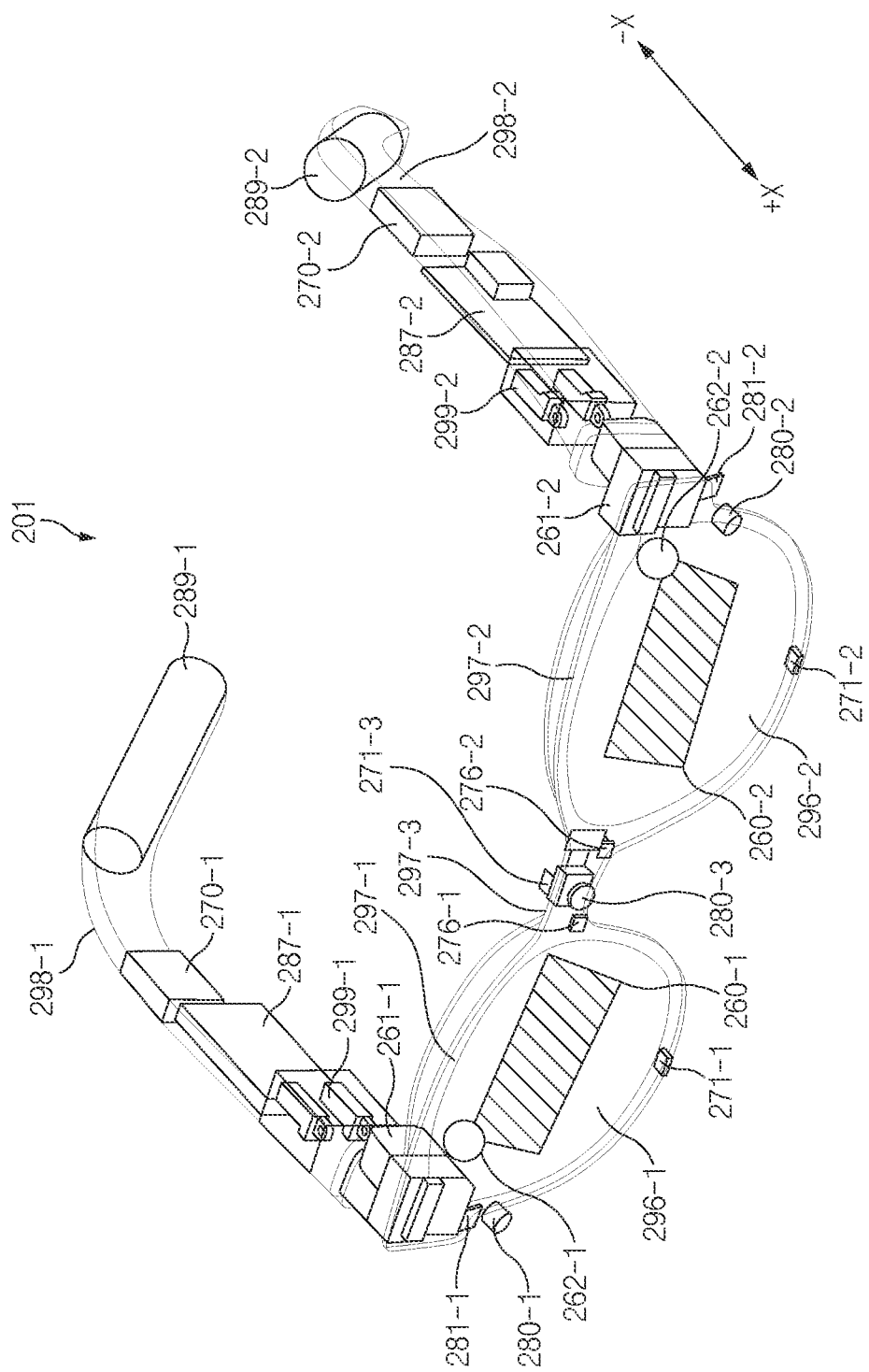
FIG. 2 is a perspective view illustrating an electronic device according to various embodiments.

FIG. 2 is a perspective view illustrating an electronic device 201 according to various embodiments.

The electronic device 201 of FIG. 2 may be referred to as a head-mounted display (HMD) device, a wearable device, smart glasses, or eyewear. The shape of the electronic device 201 illustrated in FIG. 2 is merely an example, and embodiments of the present disclosure are not limited thereto. For example, the electronic device 201 may be any electronic device configured to provide augmented reality (AR) or virtual reality (VR).

According to an embodiment, the electronic device 201 may include at least some of components of the electronic device 101 of FIG. 1. For example, the electronic device 201 may include a display (e.g., the display module 160 of FIG. 1), a camera (e.g., the camera module 180 of FIG. 1), at least one sensor (e.g., the sensor module 176 of FIG. 1), a processor (e.g., the processor 120 of FIG. 1), a battery (e.g., the battery 189 of FIG. 1), a memory (e.g., 130 of FIG. 1), or a communication circuit (e.g., the communication module 190 of FIG. 1). At least some of the components of the electronic device 201 may be positioned inside a housing 298-1, 298-2, 297-1, 297-2, or 297-3 of the electronic device 201 or may be exposed to the outside of the housing.

The electronic device 201 may include a first temple 298-1, a second temple 298-2, and frames 297-1, 297-2, and 297-3. The frames 297-1, 297-2, and 297-3 may include a first frame 297-1 connected to the first temple 298-1, a second frame 297-2 connected to the second temple 298-2 and a bridge 297-3 connecting the first frame 297-1 and the second frame 297-2. The first temple 298-1, the second temple 298-2, and the frames 297-1, 297-2, and 297-3 may be referred to as a housing. The first temple 298-1 may be physically connected to the first frame 297-1 through a first hinge portion 299-1 to support the first frame 297-1 when worn. The second temple 298-2 may be physically connected to the second frame 297-2 through the second hinge portion 299-2 to support the second frame 297-2 when worn. One end of the bridge 297-3 may be connected to the first frame 297-1, and the other end may be connected to the second frame 297-2. According to an embodiment, the bridge 297-3 may be integrally formed with the first frame 297-1 and the second frame 297-2 or may be omitted.

The electronic device 201 may include the display. For example, the electronic device 201 may include a first display 261-1 and/or a second display 261-2. The first display 261-1 and/or the second display 261-2 may include at least one of a liquid crystal display (LCD), a digital mirror device (DMD), a liquid crystal on silicon device (LCoS device), an organic light emitting diode (OLED), or a micro light emitting diode (micro LED). For example, the display of the electronic device 201 may include at least one light source for emitting light. If the first display 261-1 and/or the second display 261-2 includes one of a liquid crystal display device, a digital mirror device, or a liquid crystal on silicon device, the electronic device 201 may include at least one light source for irradiating (a) screen output area(s) 260-1 and/or 260-2 of the display with light. For another example, if the display of the electronic device 201 may generate light by itself, the display may not include a separate light source other than the light source included in the display. If the first display 261-1 and/or the second display 261-2 includes at least one of an organic light emitting diode and a micro LED, the electronic device 201 may provide an image to the user even if it does not include a separate light source. The weight of the electronic device 201 may be reduced by omitting a separate light source when the display is implemented by an organic light emitting diode or a micro LED.

According to an embodiment, the electronic device 201 may include a first transparent member 296-1 and/or a second transparent member 296-2. For example, if the user wears the electronic device 201, the user may see through the first transparent member 296-1 and/or the second transparent member 296-2. The first transparent member 296-1 and/or the second transparent member 296-2 may be formed of at least one of a glass plate, a plastic plate, or a polymer, and may be transparent or translucent. The first transparent member 296-1 may be fixed to the first frame 297-1, and the second transparent member 296-2 may be fixed to the second frame 297-2. For example, when worn, the first transparent member 296-1 may be disposed to face the user's right eye, and the second transparent member 296-2 may be disposed to face the user's left eye.

According to an embodiment, at least a portion of the first transparent member 296-1 and/or the second transparent member 296-2 may be an optical waveguide. For example, the optical waveguide may transmit an image generated by a display (e.g., the first display 261-1 and/or the second display 261-2) to the user's eyes. The optical waveguide may be formed of glass, plastic, or polymer. For example, the optical waveguide may include a nano-pattern (e.g., a polygonal or curved grating structure) formed inside or on one surface. For example, light incident to one end of the optical waveguide may be propagated inside the optical waveguide by a nano-pattern and provided to the user's eyes. For example, the optical waveguide including a free-form prism may be configured to provide incident light to the user through a reflection mirror.

According to an embodiment, the optical waveguide may include at least one of at least one diffractive element (e.g., a diffractive optical element (DOE), or a holographic optical element (HOE)) or a reflective element (e.g., a reflective mirror). The optical waveguide may guide the display light emitted from the light source to the user's eyes using at least one diffractive element or the reflective element included in the optical waveguide. For example, the diffractive element may include an input optical member (e.g., 262-1 and/or 262-2) and/or an output optical member (not shown). The first input optical member 262-1 and/or the second input optical member 262-2 may be referred to as an input grating area, and the output optical member (not shown) may be referred to as an output grating area. The input grating area may diffract or reflect light in order to transmit light output from a light source (e.g., the micro LED) to a transparent member (e.g., the first transparent member 296-1 and/or the second transparent member 296-2) of a screen display unit. The output grating area may diffract or reflect the light transmitted to the transparent member (e.g., the first transparent member 296-1 and/or the second transparent member 296-2) in the direction of the user's eyes. For example, the reflective element may include a total reflection optical element or a total reflection waveguide for total internal reflection (TIR). Total reflection may be referred to as one way of guiding light, and may refer, for example, to making an incident angle so that the light (e.g., image) input through the input grating area is reflected from one surface (e.g., the specific surface) of the optical waveguide to be transmitted to the output grating area. In an embodiment, an optical path of the light emitted from the display may be guided to the optical waveguide by the input optical member (e.g., 262-1 and/or 262-2). The light moving inside the optical waveguide may be guided toward the user's eyes through the output optical member. The screen output area(s) 260-1 and/or 260-2 may be determined based on light emitted in the eye direction. According to an embodiment, the screen output area(s) 260-1 and/or 260-2 may be included in the optical waveguide.

The electronic device 201 has been described as providing an image to the user using the optical waveguide in FIG. 2; however, embodiments of the present disclosure are not limited thereto. According to an embodiment, the display (e.g., the first display 261-1 and/or the second display 261-2) of the electronic device 201 may be a transparent or semi-transparent display. In this case, the display may be disposed at a position facing the user's eyes (e.g., the first screen output area 260-1 and/or the second screen output area 260-2).

According to an embodiment, the electronic device 201 may include at least one camera. For example, the electronic device 201 may include a first camera 280-1, a second camera 280-2, and/or a third camera 280-3. For example, the first camera 280-1 and the second camera 280-2 may be used for external image recognition. The first camera 280-1 and the second camera 280-2 may be configured to acquire an image corresponding to a direction (e.g., a +x direction) corresponding to the gaze of the user. The electronic device 201 may use the first camera 280-1 and the second camera 280-2 to perform head tracking (e.g., 3 degrees of freedom (DoF) or 6 degrees of freedom tracking), hand image detection, hand image tracking, and/or spatial recognition. For example, the first camera 280-1 and the second camera 280-2 may be a global shutter (GS) camera having the same specification and performance (e.g., the angle of view, shutter speed, resolution, and/or the number of color bits, or the like). The electronic device 201 may support a simultaneous localization and mapping (SLAM) technology by performing spatial recognition (e.g., 6-DOF spatial recognition) and/or depth information acquisition using stereo cameras disposed on the right and left. In addition, the electronic device 201 may recognize the user's gesture with stereo cameras disposed on the right and left. The electronic device 201 may detect a faster hand gesture and fine movement using a GS camera having relatively less distortion than a rolling shutter (RS) camera. For example, the third camera 280-3 may be used for external image recognition. The third camera 280-3 may be configured to acquire an image corresponding to a direction (e.g., the +x direction) corresponding to the gaze of the user. In an example, the third camera 280-3 may be a camera having a relatively higher resolution than that of the first camera 280-1 and the second camera 280-2. The third camera 280-3 may be referred to as a high resolution (HR) camera or a photo video (PV) camera. The third camera 280-3 may support functions for acquiring a high-quality image, such as auto focus (AF) and/or optical image stabilization (OIS). The third camera 280-3 may be a GS camera or an RS camera.

According to an embodiment, the electronic device 201 may include at least one eye-tracking sensor. For example, the electronic device 201 may include a first eye-tracking sensor 276-1 and a second eye-tracking sensor 276-2. The first eye-tracking sensor 276-1 and the second eye-tracking sensor 276-2 may be, for example, cameras configured to acquire an image in a direction corresponding to the user's eyes. The first eye-tracking sensor 276-1 and the second eye-tracking sensor 276-2 may be configured to respectively acquire the user's right eye image and the user's left eye image. The electronic device 201 may be configured to detect the user's pupil using the first eye-tracking sensor 276-1 and the second eye-tracking sensor 276-2. The electronic device 201 may acquire the gaze of the user from the user's pupil image and provide the image based on the acquired gaze. For example, the electronic device 201 may display the image so that the image is positioned in the direction of the gaze of the user. For example, the first eye-tracking sensor 276-1 and the second eye-tracking sensor 276-2 may be a global shutter (GS) camera having the same specification and performance (e.g., the angle of view, shutter speed, resolution, and/or the number of color bits, or the like).

According to an embodiment, the electronic device 201 may include at least one illumination unit. The illumination unit may include, for example, at least one LED. In FIG. 2, the electronic device 201 may include a first illumination unit 281-1 and a second illumination unit 281-2. The electronic device 201 may, for example, use the first illumination unit 281-1 and the second illumination unit 281-2 to provide auxiliary illumination for the first camera 280-1, the second camera 280-2, and/or the third camera 280-3. In an example, the electronic device 201 may provide illumination for acquiring a pupil image using the illumination unit (not shown). For example, the electronic device 201 may provide illumination to the eye-tracking sensor using an LED covering an infrared wavelength. In this case, the eye-tracking sensor may include an image sensor for acquiring an infrared wavelength image.

According to an embodiment, the electronic device 201 may include at least one printed circuit board (PCB). For example, the electronic device 201 may include a first PCB 287-1 positioned in the first temple 298-1 and a second PCB 287-2 positioned in the second temple 298-2. The first PCB 287-1 and/or the second PCB 287-2 may be electrically connected to other components of the electronic device 201 through a signal line and/or a flexible PCB (FPCB). For example, the communication circuit, the memory, at least one sensor, and/or the processor may be disposed on the first PCB 287-1 and/or the second PCB 287-2. For example, each of the first PCB 287-1 and the second PCB 287-2 may include a plurality of PCBs, which are spaced apart by interposers.

According to an embodiment, the electronic device 201 may include at least one battery. For example, the electronic device 201 may include a first battery 289-1 positioned at one end of the first temple 298-1 and a second battery 289 positioned at one end of the second temple 298-2. The first battery 289-1 and the second battery 289-2 may be configured to supply power to components of the electronic device 201.

According to an embodiment, the electronic device 201 may include at least one speaker. For example, the electronic device 201 may include a first speaker 270-1 and a second speaker 270-2. The electronic device 201 may be configured to provide stereo sound using speakers positioned on the right and left.

According to an embodiment, the electronic device 201 may include at least one microphone. For example, the electronic device 201 may include a first microphone 271-1, a second microphone 271-2, and/or a third microphone 271-3. The first microphone 271-1 may be positioned to the right of the frames 297-1 and 297-2, the second microphone 271-2 may be positioned to the left of the frames 297-1 and 297-2, and the third microphone 271-3 may be positioned on the bridge 297-3 of the frames 297-1 and 297-2. In an example, the electronic device 201 may perform beamforming using the first microphone 271-1, the second microphone 271-2, and/or the third microphone 271-3.

The configuration of the above-described electronic device 201 is merely an example, and embodiments of the present disclosure are not limited thereto. For example, the electronic device 201 may not include at least some of the components described with reference to FIG. 2, or may further include components other than the described components. For example, the electronic device 201 may include at least one sensor (e.g., an acceleration sensor, a gyro sensor, and/or a touch sensor) and/or an antenna.

Figure 3:
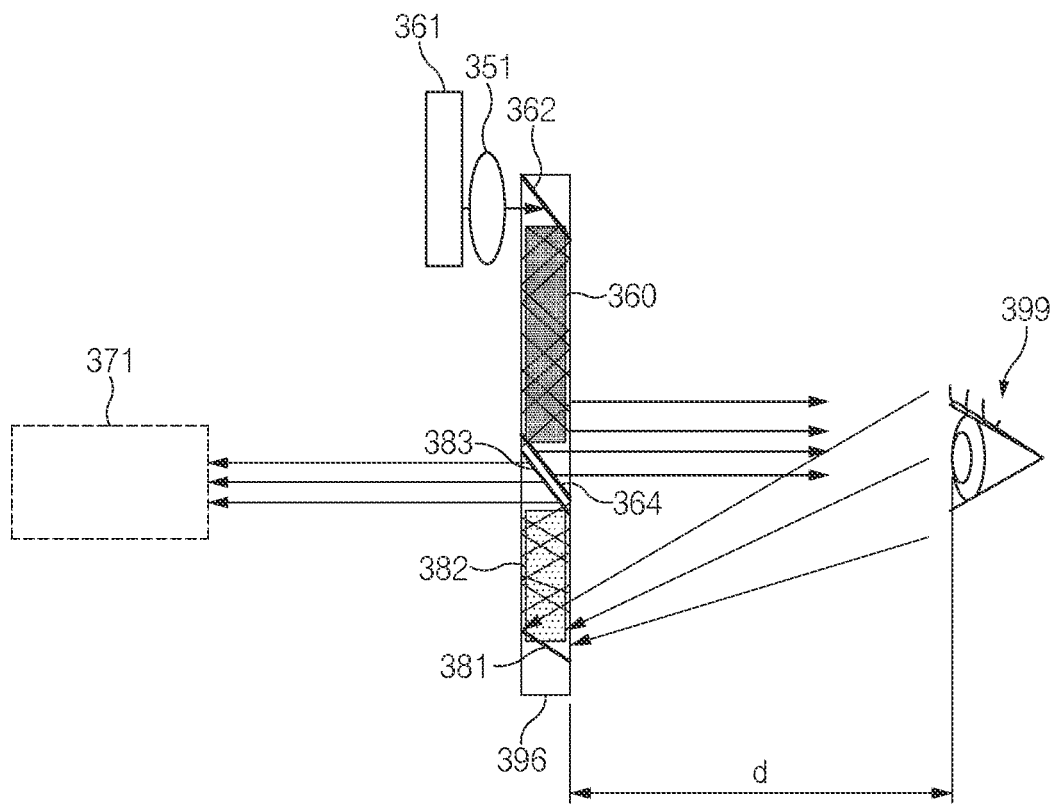
FIG. 3 is a diagram illustrating an example method for eye-tracking and display through a transparent member, according to various embodiments.

FIG. 3 is a diagram illustrating an example method for eye-tracking and display through a transparent member, according to various embodiments.

Referring to FIG. 3, a display 361 (e.g., the first display 261-1 or the second display 261-2 of FIG. 2) may provide an image through a transparent member 396 (e.g., the first transparent member 296-1 or the second transparent member 296-2 of FIG. 2). According to an embodiment, the display 361 may input light corresponding to an image to an input optical member 362 (e.g., the first input optical member 262-1 or the second input optical member 262-2 of FIG. 2) through a lens 351. The input optical member 362 may reflect or diffract the incident light and input the reflected or diffracted light into the optical waveguide 360. The output optical member 364 may output the light transmitted through the optical waveguide 360 in a direction toward the user's eye 399. In an example, the lens 351 may be included in the display 361. In an example, the position of the lens 351 may be determined based on the distance between the transparent member 396 and the user's eye 399.

The eye-tracking sensor 371 (e.g., the first eye-tracking sensor 276-1 or the second eye-tracking sensor 276-2 of FIG. 2) may acquire an image corresponding to at least a part of the user's eye 399. For example, light corresponding to the image of the user's eye 399 may be reflected and/or diffracted by a first splitter 381 and input to the optical waveguide 382. The light transmitted to the second splitter 383 through the optical waveguide 382 may be reflected and/or diffracted by a second splitter 383 and output in a direction toward the eye-tracking sensor 371.

According to an embodiment, at least some of the input optical member 362, the optical waveguides 360 and 382, the output optical member 364, the first splitter 381, and/or the second splitter 383 may be formed as one component.

Figure 4:
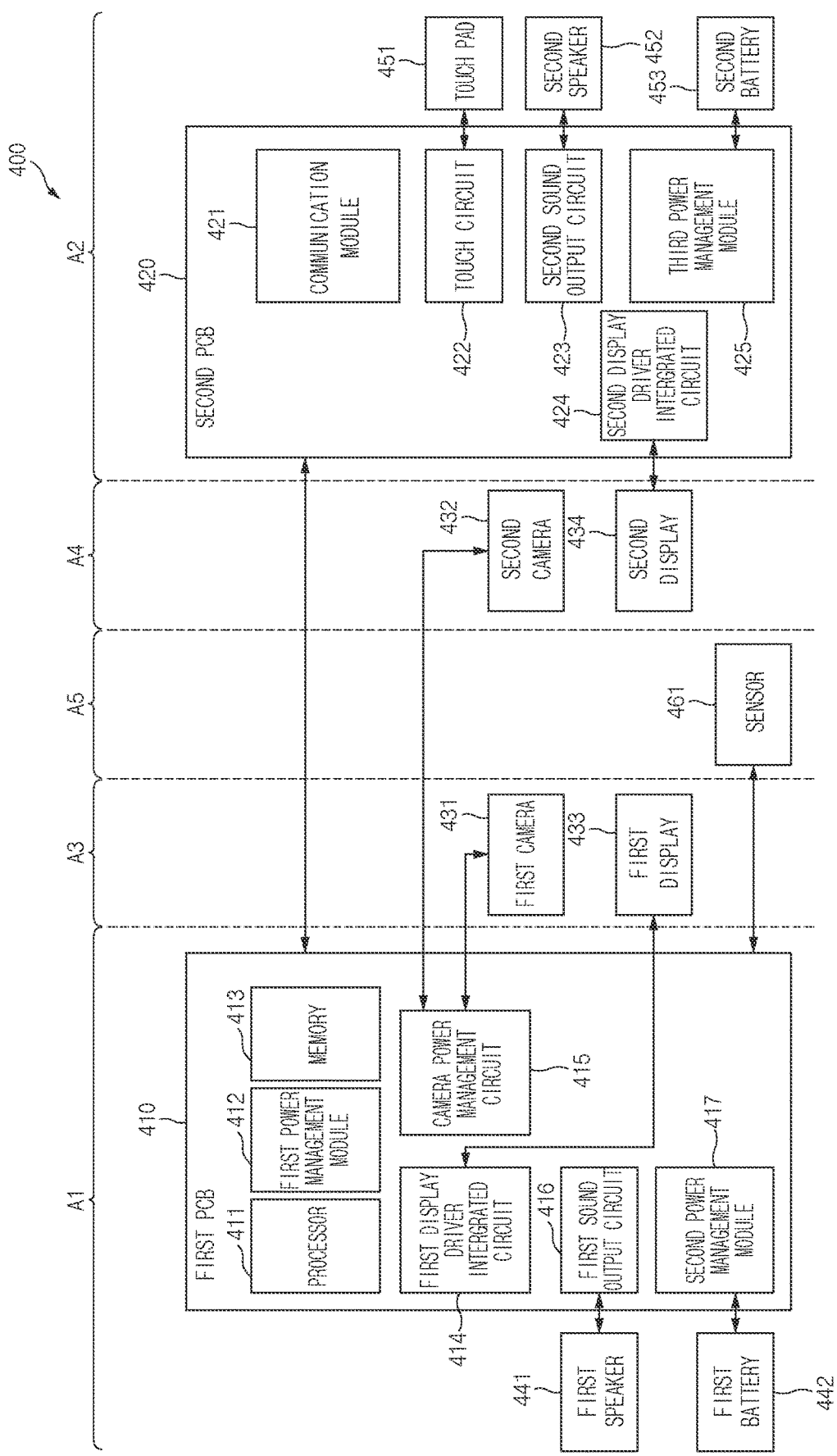
FIG. 4 is a block diagram illustrating an example configuration of an electronic device according to various embodiments.

FIG. 4 is a block diagram illustrating an example configuration of an electronic device according to various embodiments. An electronic device 400 of FIG. 4 may be referred to as the electronic device 201 of FIG. 2. The electronic device 400 according to an embodiment may include a first printed circuit board (PCB) 410, a second PCB 420, and components electrically connected to the first PCB 410 or the second PCB 420. For example, the components of the electronic device 400 may include a first speaker 441 (e.g., the first speaker 270-1 of FIG. 2), a second speaker 452 (e.g., the second speaker 270-2 of FIG. 2), a first battery 442 (e.g., the first battery 289-1 of FIG. 2), a second battery 453 (e.g., the second battery 289-2 of FIG. 2), a touch pad 451, a first camera 431 (e.g., the first camera 280-1 of FIG. 2), a second camera 432 (e.g., the second camera 280-2 of FIG. 2), a first display 433 (e.g., the first display 261-1 of FIG. 2), a second display 434 (e.g., the second display 261-2 of FIG. 2), and a sensor 461. The sensor 461 may include a third camera (e.g., the third camera 280-3 of FIG. 2) or a microphone (e.g., the third microphone 271-3 of FIG. 2).

According to an embodiment, the first PCB 410, the first speaker 441, and the first battery 442 may be positioned in a first temple area A1. For example, the first temple area A1 may refer to an area within a first temple (e.g., the first temple 298-1 of FIG. 2) or an area on the first temple. According to an embodiment, the second PCB 420, the touch pad 451, the second speaker 452, and the second battery 453 may be positioned in a second temple area A2. For example, the second temple area A2 may refer to an area within a second temple (e.g., the second temple 298-2 of FIG. 2) or an area on the second temple. According to an embodiment, the first camera 431 and the first display 433 may be positioned in a first frame area A3. For example, the first frame area A3 may refer to an area within a first frame (e.g., the first frame 297-1 of FIG. 2) or an area on the first frame. According to an embodiment, the second camera 432 and the second display 434 may be positioned in a second frame area A4. For example, the second frame area A4 may refer to an area within a second frame (e.g., the second frame 297-2 of FIG. 2) or an area on the second frame. According to an embodiment, the sensor 261 may be positioned in a bridge area A5 between the first frame area A3 and the second frame area A4. For example, the bridge area A5 may refer to an area within or on a bridge (e.g., the bridge 297-3 of FIG. 2).

According to an embodiment, the first PCB 410 may include a processor (e.g., including processing circuitry) 411 (e.g., the processor 120 of FIG. 1), a first power management module (e.g., including power management circuitry) 412 (e.g., the power management module 188 of FIG. 1), a memory 413 (e.g., the memory 130 of FIG. 1), a first display driver integrated circuit 414, a camera power management circuit 415, a first sound output circuit 416, and a second power management module (e.g., including power management circuitry) 417.

The first power management module 412 may include various circuitry and manage power supplied to the electronic device 400. For example, the first power management module 412 may be directly connected to the processor 411 to supply power to the processor 411. The first display driver integrated circuit 414 may be electrically connected to the first display 433 to transmit image data for display information and signals for driving the first display 433 to the first display 433. The camera power management circuit 415 may be electrically connected to the first camera 431 and the second camera 432 to transmit power for driving the first camera 431 and the second camera 432. The first sound output circuit 416 may be electrically connected to the first speaker 441 to transmit sound data to the first speaker 441. The second power management module 417 may be electrically connected to the first battery 442 to manage the charging power of the first battery 442.

According to an embodiment, the second PCB 420 may include a communication module (e.g., including communication circuitry) 421 (e.g., the communication module 190 of FIG. 1), a touch circuit 422, a second sound output circuit 423, a second display driver integrated circuit 424, and a third power management module (e.g., including power management circuitry) 425.

The touch circuit 422 may be electrically connected to the touch pad 451 to transmit a touch signal for sensing a touch to the touch pad 451. The second sound output circuit 423 may be electrically connected to the second speaker 452 to transmit sound data to the second speaker 452. The second display driver integrated circuit 424 may be electrically connected to the second display 434 to transmit image data for display information and signals for driving the second display 434 to the second display 434. The second power management module 425 may be electrically connected to the second battery 453 to manage the charging power of the second battery 453.

The first PCB 410 and the second PCB 420 may be electrically connected to transmit and receive signals or data. For example, the first PCB 410 may transmit or receive data for screen output (e.g., image data for display information), communication data (e.g., a Bluetooth signal, a Wi-Fi signal), sound data, or touch data to the second PCB 420 or from the second PCB 420. The first PCB 410 positioned in the first temple area A1 and the second PCB 420 positioned in the second temple area A2 may be electrically connected through a flexible printed circuit board.

In addition, the first PCB 410 may be electrically connected to the first camera 431 and the first display 433 positioned in the first frame area A3, the second camera 432 positioned in the second frame area A4, and at least one sensor 461 positioned in the bridge area A5 through the flexible printed circuit board.

Figure 5:
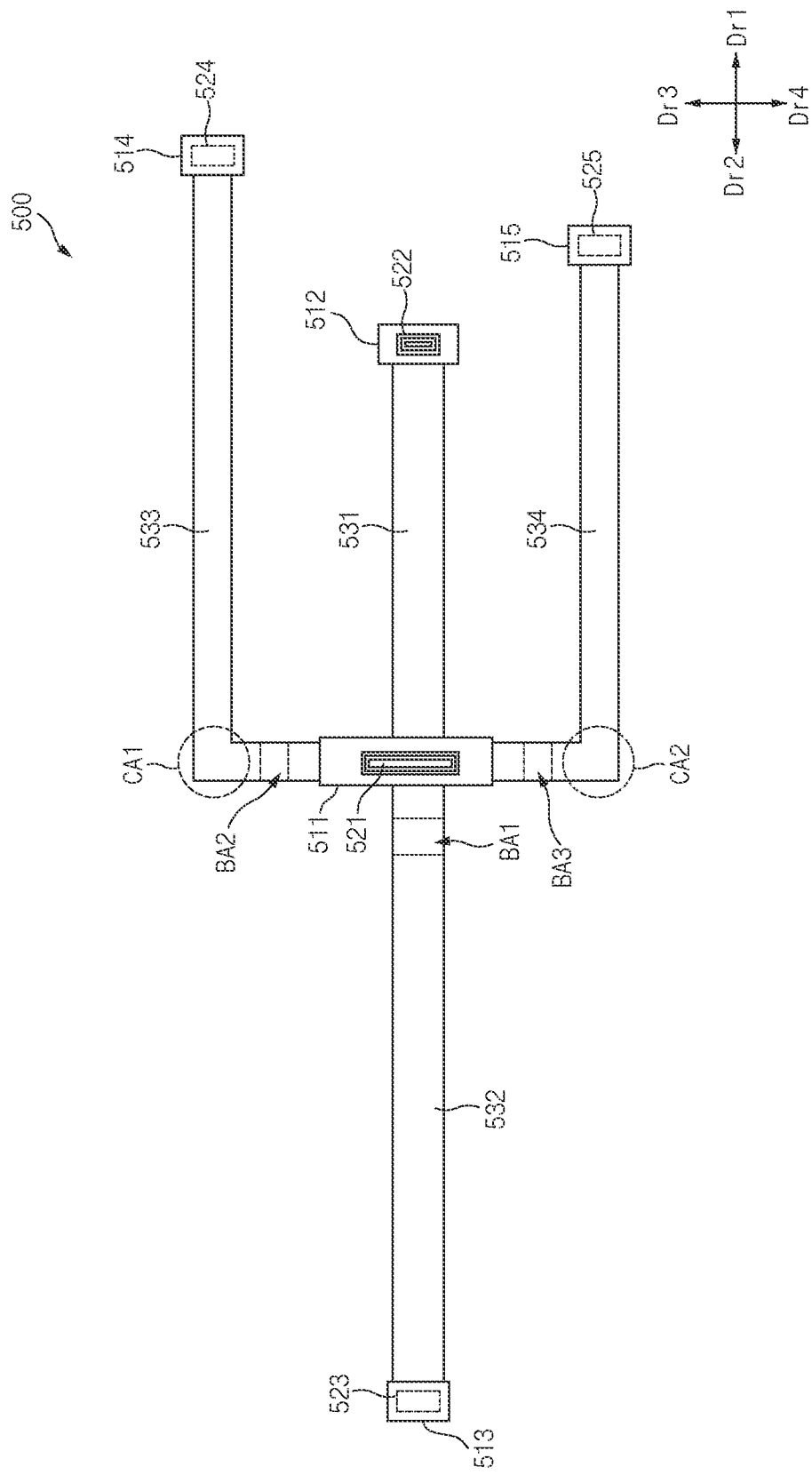
FIG. 5 is a plan view illustrating an unfolded state of a flexible printed circuit board according to various embodiments.
Figure 6:
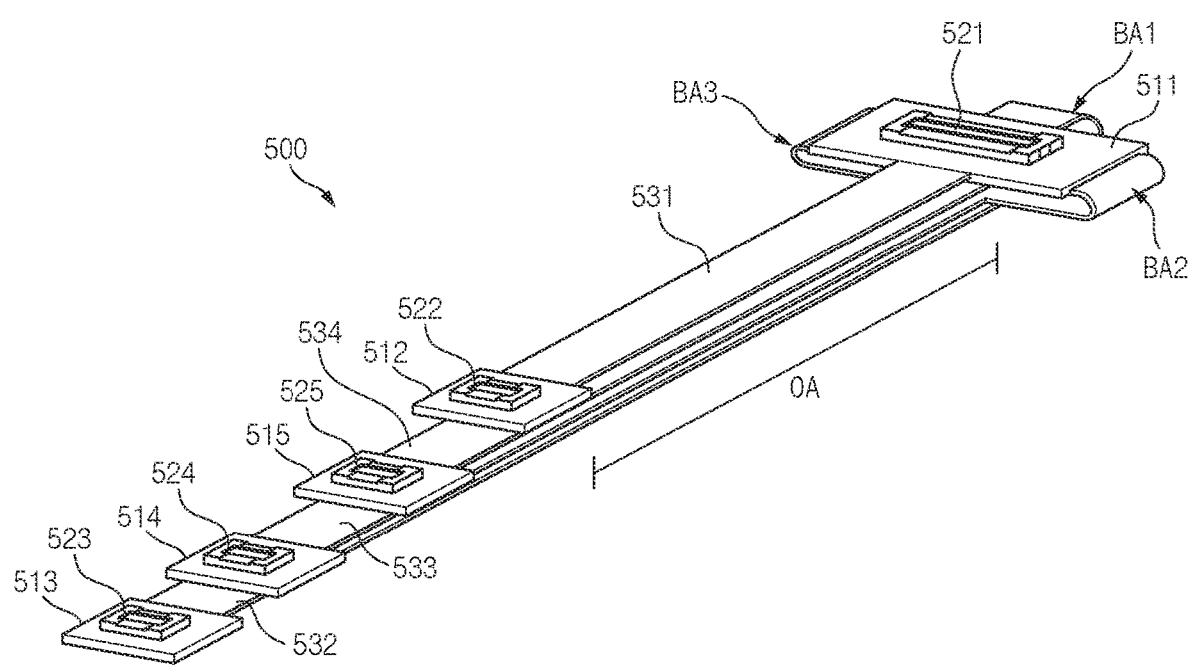
FIG. 6 is a plan view illustrating a bent state of the flexible printed circuit board according to various embodiments.

Hereinafter, a flexible printed circuit board 500 according to various embodiments will be described in greater detail below with reference to FIGS. 5 and 6. FIG. 5 is a diagram illustrating an unfolded state of a flexible printed circuit board according to various embodiments. FIG. 6 is a diagram illustrating a bent state of the flexible printed circuit board according to various embodiments.

The flexible printed circuit board 500 according to an embodiment may be a rigid-flexible printed circuit board (RF PCB) including at least one rigid member (e.g. rigid portion) 511, 512, 513, 514, or 515 and at least one flexible member (e.g. flexible portion) 531, 532, 533, or 534. The rigid members 511, 512, 513, 514, and 515 may include a substrate and electrical components (e.g., connectors 521, 522, 523, 524, and 525) mounted on the substrate. The substrate of the rigid members 511, 512, 513, 514, and 515 may include a material having a relatively strong resistance to deformation, and thus may not be easily bent by an external force. The flexible members 531, 532, 533, and 534 may include a substrate and electrical components (e.g., conductive patterns) mounted on the substrate. The substrate of the flexible members 531, 532, 533, and 534 may include a flexible material and thus may be bent. The rigid members 511, 512, 513, 514, and 515 may be thicker than the flexible members 531, 532, 533, and 534. For example, the rigid members 511, 512, 513, 514, and 515 may be 0.1 mm to 0.2 mm thicker than the flexible members 531, 532, 533, and 534.

The flexible printed circuit board 500 according to an embodiment may include a first rigid member 511 and at least two of the flexible members 531, 532, 533, and 534 extending by being drawn out from the first rigid member 511 in different directions. For example, the at least two of the flexible members 531, 532, 533, and 534 may include a first flexible member 531 extending by being drawn out from the first rigid member 511 in a first direction Dr1 (e.g., a +x-axis direction), a second flexible member 532 extending by being drawn out in a second direction Dr2 (e.g., a −x-axis direction), a third flexible member 533 extending by being drawn out in a third direction Dr3 (e.g., a +y-axis direction), and a fourth flexible member 534 extending by being drawn out in a fourth direction Dr4 (e.g., a −y-axis direction). The number and drawing-out directions of the flexible members shown in FIGS. 5 and 6 are merely examples, and the number and drawing-out directions of the flexible members are not limited thereto.

The flexible printed circuit board 500 according to an embodiment may further include the rigid members 512, 513, 514, and 515 connected to ends of at least two of the flexible members 531, 532, 533, and 534 and the connectors 521, 522, 523, 524, and 525 positioned on the rigid members 511, 512, 513, 514, and 515. For example, the flexible printed circuit board 500 may include a second rigid member 512 connected to the first flexible member 531, a third rigid member 513 connected to the second flexible member 532, a fourth rigid member 514 connected to the third flexible member 533, and a fifth rigid member 515 connected to the fourth flexible member 534. The first rigid member 511 may have an elongated shape in one direction, and the longitudinal direction of the first rigid member 511 is not limited to those shown in FIGS. 5 and 6. For example, the longitudinal direction of the first rigid member 511 may be different from the longitudinal directions of the other rigid members 512, 513, 514, and 515.

On the rigid members 511, 512, 513, 514, and 515, an connection member (e.g., a connector) capable of being electrically connected to other components may be positioned. For example, the flexible printed circuit board 500 may include a first connector 521 positioned on the first rigid member 511, a second connector 522 positioned on the second rigid member 512, a third connector 523 positioned on the third rigid member 513, a fourth connector 524 positioned on the fourth rigid member 514, and a fifth connector 525 positioned on the fifth rigid member 515. The first connector 521 positioned on the first rigid member 511 may be electrically connected to the first PCB (e.g., the first PCB 410 of FIG. 4), the second connector 522, and the third connector 523, the fourth connector 524, and the fifth connector 525 may be electrically connected to the first connector 521 through flexible members 531, 532, 533, and 534 (or conductive patterns mounted on the flexible members). Each of the second connector 522, the third connector 523, the fourth connector 524, and the fifth connector 525 may be electrically connected to at least one component of an electronic device (e.g., the electronic device 400 of FIG. 4). Accordingly, the first PCB connected to the first connector 521 may be electrically connected to at least one component connected to each of the second connector 522, the third connector 523, the fourth connector 524, and the fifth connector 525. For example, the first PCB 410, the second PCB 420, the first camera 431, the second camera 432, and the first display 433, the second display 434, and/or the sensor 461 of FIG. 4 may be electrically connected through the flexible printed circuit board 500.

At least one flexible member (532, 533, or 534) of the at least two of the flexible members 531, 532, 533, and 534 may include a bending area BA1, BA2, or BA3 that is bent in one direction. At least one of the flexible members 532, 533, and 534 may be bent in one direction (e.g., a rear direction) in the bending area BA1, BA2, or BA3 such that the flexible members 531, 532, 533, and 534 at least partially overlap each other. The flexible printed circuit board 500 according to an embodiment may include an overlapping area OA in which at least two of the flexible members 531, 532, 533, and 534 drawn out from the first rigid member 511 in different directions overlap each other and extend in one direction. According to an embodiment, a portion of the overlapping area OA may be disposed to overlap a hinge portion (e.g., the first hinge portion 299-1 of FIG. 2) of the electronic device.

For example, the first flexible member 531 may extend by being drawn out from the first rigid member 511 in the first direction Dr1. One end of the first flexible member 531 may be connected to the first rigid member 511, and the other end thereof may be connected to the second rigid member 512.

The second flexible member 532 may extend by being drawn out from the first rigid member 511 in the second direction Dr2, and may extend in the first direction Dr1, which is opposite to the second direction Dr2, by being bent in one direction in the first bending area BA1. For example, the second flexible member 532 may at least partially overlap the first rigid member 511 by being drawn out from the first rigid member 511 and being bent in the rear direction. A portion of the second flexible member 532 may overlap the first flexible member 531, the third flexible member 533, and the fourth flexible member 534, and may extend in the first direction Dr1. One end of the second flexible member 532 may be connected to the first rigid member 511, and the other end thereof may be connected to the third rigid member 513.

The third flexible member 533 may include a second bending area BA2 and a first curved area CA1 in which an extension direction is bent at a predetermined angle. The third flexible member 533 may extend by being drawn out from the first rigid member 511 in the third direction Dr3, and may extend in the fourth direction Dr4, which is opposite to the third direction Dr3, by being bent in one direction in the second bending area BA2. For example, the third flexible member 533 may at least partially overlap the first rigid member 511 by being drawn out from the first rigid member 511 and being bent in the rear direction. The third flexible member 533 extending in the fourth direction Dr4 may extend in the first direction Dr1 by being bent in the first curved area CA1. A portion of the third flexible member 533 may overlap the first flexible member 531, the second flexible member 532, and the fourth flexible member 534, and may extend in the first direction Dr1. One end of the third flexible member 533 may be connected to the first rigid member 511, and the other end thereof may be connected to the fourth rigid member 514.

The fourth flexible member 534 may include a third bending area BA3 and a second curved area CA2 in which an extension direction is bent at a predetermined angle. The fourth flexible member 534 may extend by being drawn out from the first rigid member 511 in the fourth direction Dr4, and may extend in the third direction Dr3, which is opposite to the fourth direction Dr4, by being bent in one direction in the third bending area BA3. For example, the fourth flexible member 534 may at least partially overlap the first rigid member 511 by being drawn out from the first rigid member 511 and being bent in the rear direction. The fourth flexible member 534 extending in the third direction Dr3 may extend in the first direction Dr1 by being bent in the second curved area CA2. A portion of the fourth flexible member 534 may overlap the first flexible member 531, the second flexible member 532, and the third flexible member 533, and may extend in the first direction Dr1. One end of the fourth flexible member 534 may be connected to the first rigid member 511, and the other end thereof may be connected to the fifth rigid member 515.

The size of the first bending area BA1 of the second flexible member 532, the size of the second bending area BA2 of the third flexible member 533, and the size of the third bending area BA3 of the fourth flexible member 534 may be different from one another. The size (or bending angle) of the first curved area CA1 of the third flexible member 533 may be different from the size (or bending angle) of the second curved area CA2 of the fourth flexible member 534.

The first flexible member 531, the second flexible member 532, the third flexible member 533, and the fourth flexible member 534 may overlap each other in the overlapping area OA and extend in one direction. According to an embodiment, in the overlapping area OA, the first flexible member 531, the fourth flexible member 534, the third flexible member 533, and the second flexible member 532 may be positioned in this order. For example, the flexible members 532, 533, and 534 of the flexible printed circuit board 500 according to an embodiment may be folded in the bending areas BA1, BA2, and BA3 in the order of the fourth flexible member 534, the third flexible member 533, and the second flexible member 532. However, the arrangement of the first flexible member 531, the second flexible member 532, the third flexible member 533, and the fourth flexible member 534 is not limited to that illustrated in FIG. 6. The folding order of the first flexible member 531, the second flexible member 532, the third flexible member 533, and the fourth flexible member 534 may be determined based on the shape in which the first connector 521, the second connector 522, the third connector 523, the fourth connector 524, and the fifth connector 525 may be exposed to the outside. For example, if the first flexible member 531, the second flexible member 532, the third flexible member 533, and the fourth flexible member 534 extend in one direction, the first flexible member 531, the second flexible member 532, the third flexible member 533, and the fourth flexible member 534 may have different lengths. The shapes of the first flexible member 531, the second flexible member 532, the third flexible member 533, and the fourth flexible member 534 are not limited to those shown in FIGS. 5 and 6, and the first flexible member 531, the second flexible member 532, the third flexible member 533, and the fourth flexible member 534 may further include a bending or folding area after the overlapping area OA, depending on the positions of connected components.

Figure 7:
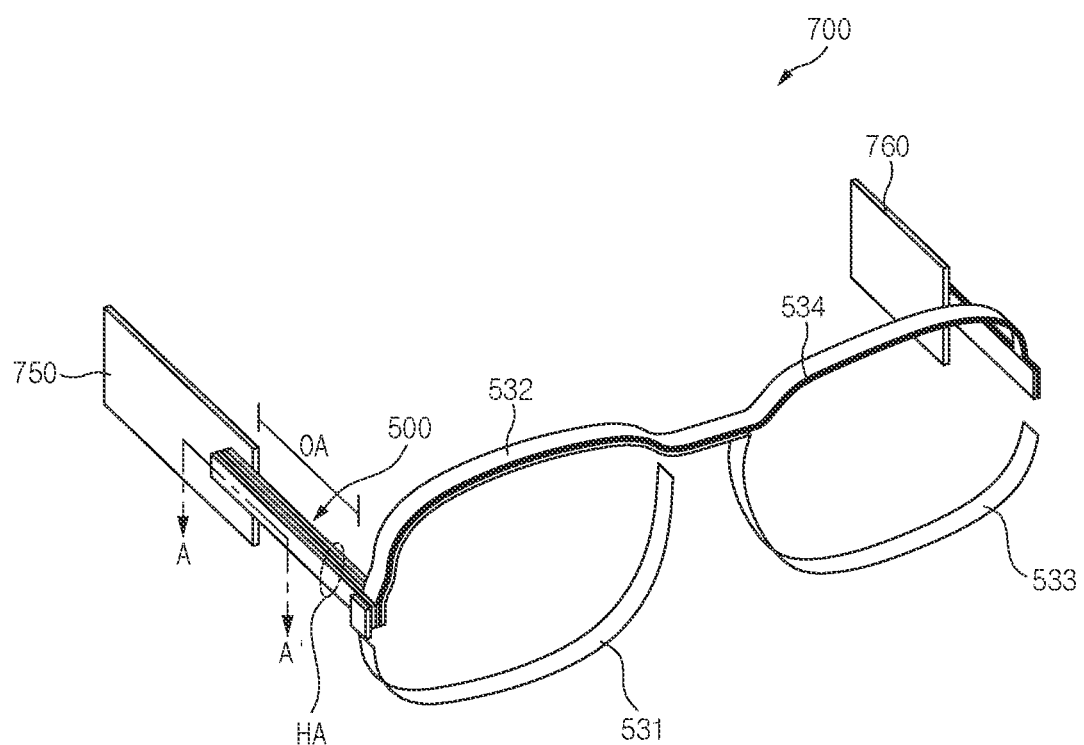
FIG. 7 is a perspective view illustrating an electronic device according to various embodiments.

Hereinafter, an electronic device 700 according to an embodiment will be described in greater detail below with reference to FIG. 7. FIG. 7 is a perspective view illustrating an electronic device according to various embodiments. The electronic device 700 (e.g., the electronic device 101 of FIG. 1, the electronic device 201 of FIG. 2, or the electronic device 400 of FIG. 4) according to various embodiments may include a first PCB 750 (e.g.; the first PCB 287-1 of FIG. 2 or the first PCB 410 of FIG. 4), a second PCB 760 (e.g., the second PCB 287-2 of FIG. 2 or the second PCB 420 of FIG. 4), and a flexible printed circuit board 500 electrically connecting the first PCB 750 and other components of the electronic device 700. The flexible printed circuit board 500 may be referred to as the flexible printed circuit board 500 of FIGS. 5 and 6.

An overlapping area OA in which flexible members 531, 532, 533, and 534 of the flexible printed circuit board 500 overlap each other and extend in one direction may be positioned in a hinge area HA, which is an area adjacent to a hinge portion (e.g., the first hinge portion 299-1 of FIG. 2) of the electronic device 700. For example, the overlapping area OA may overlap the hinge portion of the electronic device 700. The flexible printed circuit board 500 of the electronic device 700 according to an embodiment may include the overlapping area OA in which the flexible members 531, 532, 533, and 534 drawn out in multiple directions overlap each other and extend in one direction, and the overlapping area OA may be positioned in a first temple area (e.g., the first temple area A1 of FIG. 4) and the hinge area HA such that the first PCB 750 and the flexible printed circuit board 500 connected to the first PCB 750 may be positioned on a narrow temple (e.g., the first temple 298-1 of FIG. 2) of the electronic device 700.

The flexible members 531, 532, 533, and 534 of the flexible printed circuit board 500 may extend to positions of components of the electronic device 700 connected to the first PCB 750. A first flexible member 531 may extend along the first temple and at least a portion of a first frame, and may be connected to an electrical component positioned in the first frame. For example, the first flexible member 531 may extend from the first PCB 750 to the position of a first camera (e.g., the first camera 431 of FIG. 4) positioned in a first frame area (e.g., the first frame area A3 of FIG. 4) through the first temple area and the hinge area HA. According to an embodiment, one end of the first flexible member 531 may be electrically connected to the first PCB 750 through a first connector 521, and the other end thereof may be electrically connected to the first camera through a second connector 522. The first PCB 750 and the first camera may be electrically connected through the first flexible member 531. A second flexible member 532 may extend along the first temple, at least a portion of the first frame, a bridge, at least a portion of the second frame, and at least a portion of the second temple, and may be connected to an electrical component positioned in the second temple. For example, the second flexible member 532 may extend from the first PCB 750 to the position of the second PCB 760 positioned in a second temple area (e.g., the second temple area A2 of FIG. 4) through the first temple area and the hinge area HA. According to an embodiment, one end of the second flexible member 532 may be electrically connected to the first PCB 750 through the first connector 521, and the other end thereof may be electrically connected to the second PCB 760 through a third connector 523. The first PCB 750 and the second PCB 760 may be electrically connected through the second flexible member 532. A third flexible member 533 may extend along the first temple, at least a portion of the first frame, the bridge, and at least a portion of the second frame, and may be connected to an electrical component positioned in the second frame. For example, the third flexible member 533 may extend from the first PCB 750 to the position of a second camera (e.g., the second camera 432 of FIG. 4) positioned in a second frame area (e.g., the second frame area A4 of FIG. 4) through the first temple area and the hinge area HA. According to an embodiment, one end of the third flexible member 533 may be electrically connected to the first PCB 750 through a first connector 521, and the other end thereof may be electrically connected to the second camera through a fourth connector 524. The first PCB 750 and the second camera may be electrically connected through the third flexible member 533. A fourth flexible member 534 may extend along the first temple and at least a portion of the first frame, and may be connected to an electrical component positioned in the first frame. For example, the fourth flexible member 534 may extend from the first PCB 750 to the position of a first display (e.g., the first display 433 of FIG. 4) positioned in the first frame area through the first temple area and the hinge area HA. According to an embodiment, one end of the fourth flexible member 534 may be electrically connected to the first PCB 750 through the first connector 521, and the other end thereof may be electrically connected to the first display through a fifth connector 525. The first PCB 750 and the first display may be electrically connected through the fourth flexible member 534.

Figure 8:
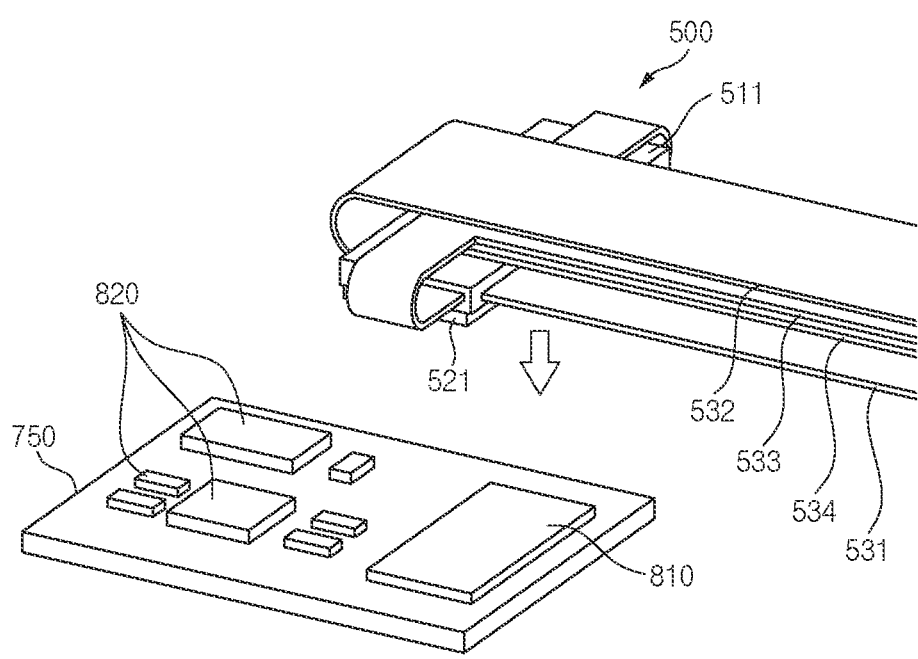
FIG. 8 is a perspective view illustrating a connecting portion between a first PCB and a flexible printed circuit board in the electronic device according to various embodiments.
Figure 9:
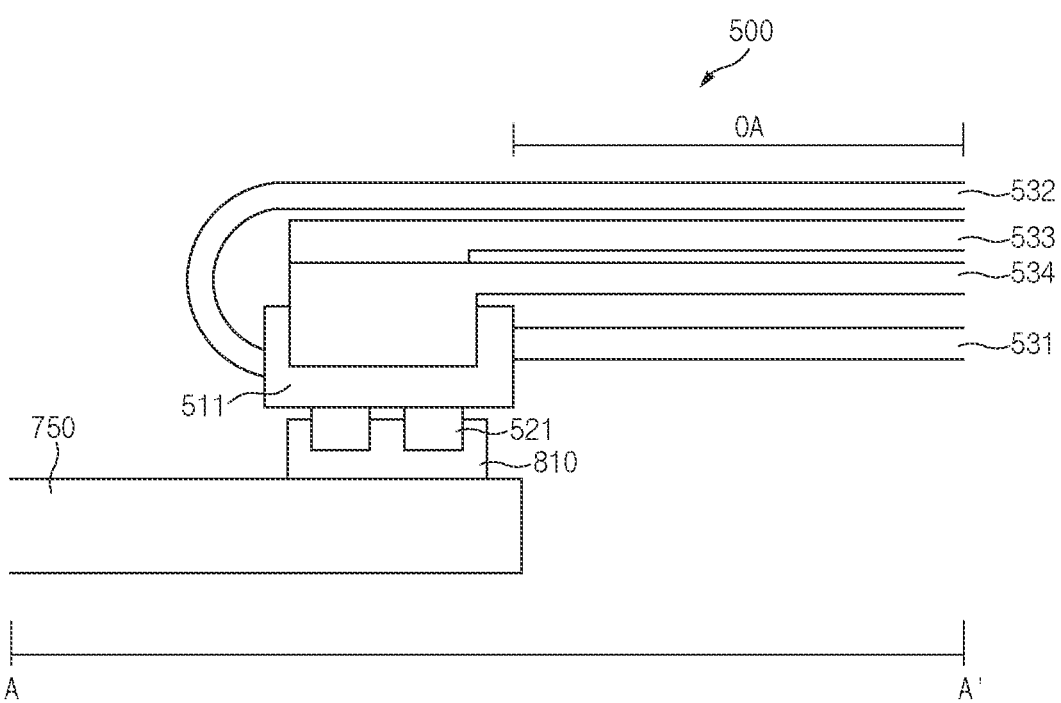
FIG. 9 is a cross-sectional view taken along line A-A' of FIG. 7 according to various embodiments.

Hereinafter, a connecting portion between the first PCB 750 and the flexible printed circuit board 500 in the electronic device according to an embodiment will be described in greater detail below with reference to FIGS. 8 and 9. FIG. 8 is a perspective view illustrating a connecting portion between the first PCB 750 and the flexible printed circuit board 500 in the electronic device according to various embodiments. FIG. 9 is a cross-sectional view taken along line A-A' of FIG. 7 according to various embodiments. The flexible printed circuit board 500 of FIGS. 8 and 9 may be referred to as the flexible printed circuit board 500 of FIGS. 5, 6, and 7. The flexible printed circuit board 500 of FIGS. 8 and 9 may illustrate some areas of the flexible printed circuit board 500 according to various embodiments.

Referring to FIGS. 8 and 9, the electronic device according to an embodiment may include the first PCB 750 and the flexible printed circuit board 500. The first PCB 750 may include electrical components 820 (e.g., the processor 411, the first power management module 412, the memory 413, the first display driver integrated circuit 414, the camera power management circuit 415, the first sound output circuit 416, or the second power management module 417 of FIG. 4) and a contact portion 810 electrically connected to the electrical components 820. One contact portion 810 of the first PCB 750 may be electrically connected to at least two components 820, and an area occupied by the contact portion 810 in the first PCB 750 may be reduced. The flexible printed circuit board 500 may include the first rigid member 511, at least two of the flexible members 531, 532, 533, and 534 extending by being drawn out from the first rigid member 511 in different directions, and the connector 521 positioned on the first rigid member 511. The connector 521 may be electrically connected to the flexible members 531, 532, 533, and 534.

The connector 521 of the flexible printed circuit board 500 may be electrically connected to the contact portion 810 of the first PCB 750. For example, the connector 521 of the flexible printed circuit board 500 may include a plurality of pins, and the contact portion 810 of the first PCB 750 may include a plurality of grooves. The plurality of pins of the connector 521 of the flexible printed circuit board 500 may be inserted into (or coupled with) the plurality of grooves of the contact portion 810 of the first PCB 750. The flexible members 531, 532, 533, and 534 of the flexible printed circuit board 500 may be electrically connected to at least one of the electrical components 820 of the first PCB 750 via the connector 521 and the contact portion 810.

Figure 10:
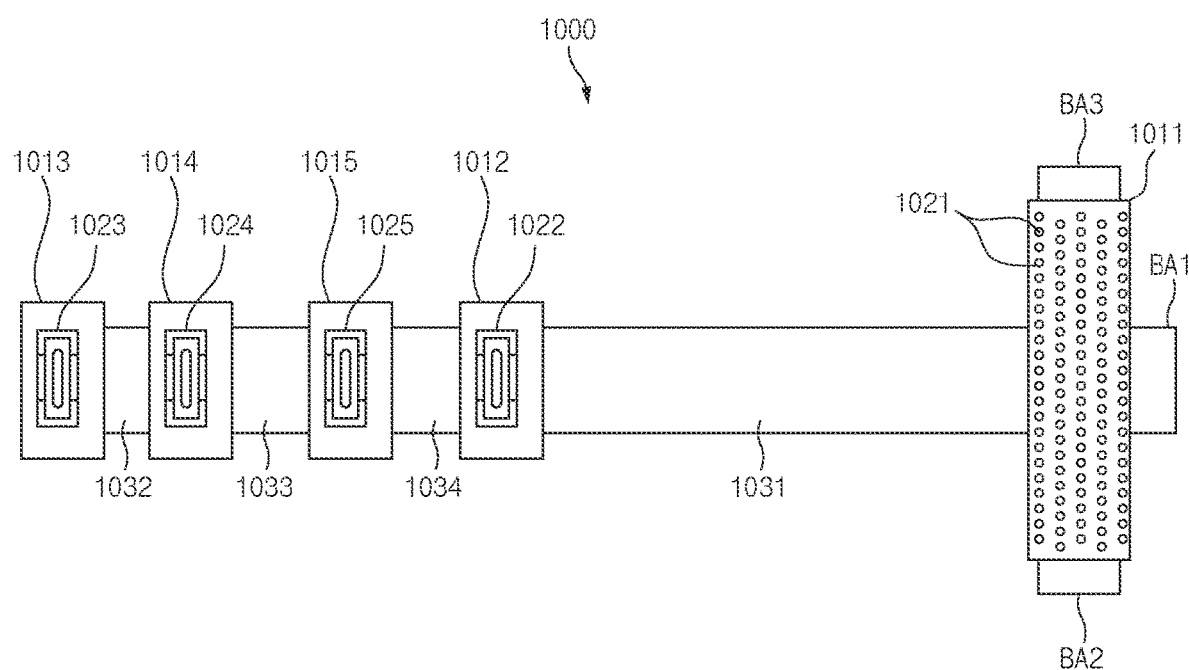
FIG. 10 is a diagram illustrating a flexible printed circuit board of an electronic device according to various embodiments.
Figure 11:
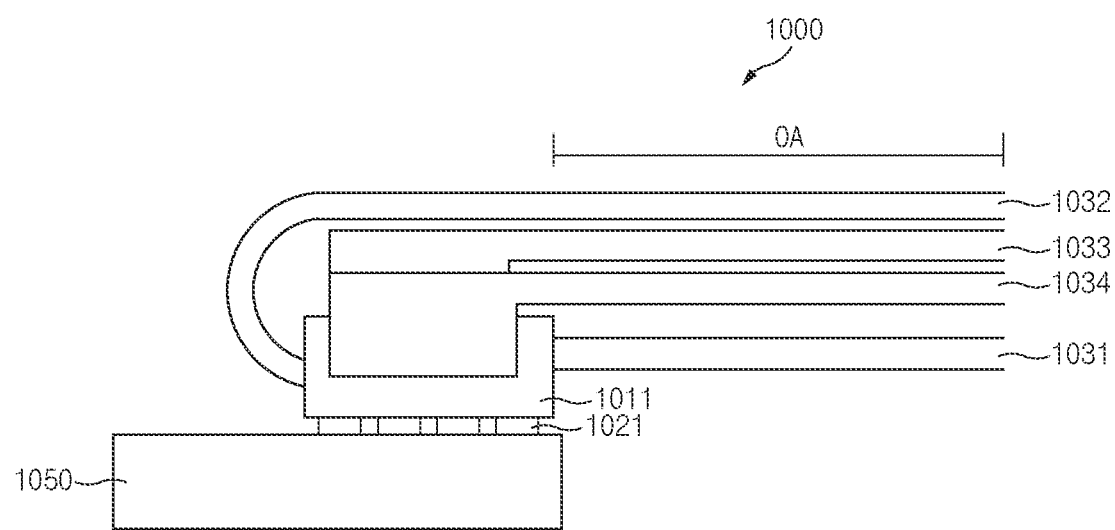
FIG. 11 is a cross-sectional view illustrating the electronic device according to various embodiments.

Hereinafter, an electronic device according to an embodiment will be described in greater detail below with reference to FIGS. 10 and 11. FIG. 10 is a diagram illustrating a flexible printed circuit board of an electronic device according to various embodiments. FIG. 11 is a cross-sectional view illustrating the electronic device according to various embodiments.

Referring to FIGS. 10 and 11, an electronic device according to an embodiment may include a first PCB 1050 (e.g., the first PCB 287-1 of FIG. 2 or the first PCB 410 of FIG. 4) and a flexible printed circuit board 1000 (e.g., the flexible printed circuit board 500 of FIG. 5). The flexible printed circuit board 1000 may include a first rigid member 1011, a conductive member 1021 positioned on the first rigid member 1011 for bonding to the first PCB 1050, and at least two of flexible members 1031, 1032, 1033, and 1034 extending by being drawn out from the first rigid member 1011 in different directions. For example, at least two of the flexible members 1031, 1032, 1033, and 1034 may include a first flexible member 1031, a second flexible member 1032, a third flexible member 1033, and a fourth flexible member 1034. The first rigid member 1011 may have an elongated shape in one direction, and the longitudinal direction of the first rigid member 1011 is not limited to that shown in FIG. 10. For example, the longitudinal direction of the first rigid member 1011 may be different from the longitudinal directions of the other rigid members 1012, 1013, 1014, and 1015.

The flexible printed circuit board 500 according to an embodiment may further include the rigid members 1012, 1013, 1014, and 1015 connected to ends of at least two of the flexible members 1031, 1032, 1033, and 1034 and the connectors 1022, 1023, 1024, and 1025 positioned on the rigid members 1012, 1013, 1014, and 1015. For example, the flexible printed circuit board 1000 may include a second rigid member 1012 connected to the first flexible member 1031, a third rigid member 1013 connected to the second flexible member 1032, a fourth rigid member 1014 connected to the third flexible member 1033, and a fifth rigid member 1015 connected to the fourth flexible member 1034. In addition, the flexible printed circuit board 1000 may include a second connector 1022 positioned on the second rigid member 1012, a third connector 1023 positioned on the third rigid member 1013, a fourth connector 1024 positioned on the fourth rigid member 1014, and a fifth connector 1025 positioned on the fifth rigid member 1015.

The first PCB 1050 and the flexible printed circuit board 1000 may be electrically connected by hot-bar bonding using heat or pressure. The electronic device according to an embodiment may include the conductive member 1021 positioned between the first PCB 1050 and the first rigid member 1011 of the flexible printed circuit board 1000, and the first PCB 1050, the conductive member 1021, and the flexible printed circuit board 1000 may be bonded by the hot-bar process. The flexible members 1031, 1032, 1033, and 1034 of the flexible printed circuit board 1000 may be electrically connected to at least one of electrical components of the first PCB 1050 via the conductive member 1021.

Figure 12:
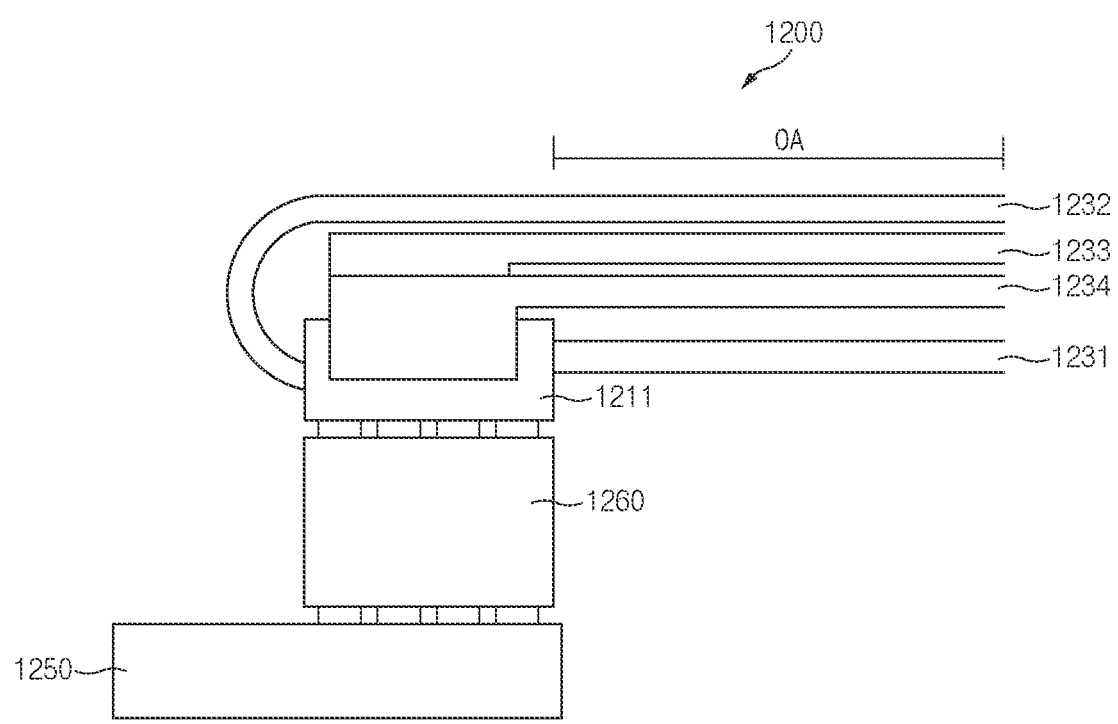
FIG. 12 is a cross-sectional view illustrating an electronic device according to various embodiments.

Hereinafter, an electronic device according to an embodiment will be described in greater detail below with reference to FIG. 12. FIG. 12 is a cross-sectional view illustrating an electronic device according to various embodiments.

Referring to FIG. 12, an electronic device according to an embodiment may include a first PCB 1250 (e.g., the first PCB 287-1 of FIG. 2 or the first PCB 410 of FIG. 4), a flexible printed circuit board 1200 (e.g., the flexible printed circuit board 500 of FIG. 5), and an interposer 1260. The flexible printed circuit board 1200 may include a first rigid member 1211 and at least two of flexible members 1231, 1232, 1233, and 1234 extending by being drawn out from the first rigid member 1211 in different directions. For example, at least two of the flexible members 1231, 1232, 1233, and 1234 may include a first flexible member 1231, a second flexible member 1232, a third flexible member 1233, and a fourth flexible member 1234.

In the electronic device according to an embodiment, the flexible printed circuit board 1200 and the first PCB 1250 may be electrically connected to each other via the first rigid member 1211 of the flexible printed circuit board 1200 and the interposer 1260 contacting the first PCB 1250.

An electronic device (e.g., the electronic device 101 of FIG. 1, the electronic device 201 of FIG. 2, or the electronic device 400 of FIG. 4) according to various example embodiments may include: a housing including a frame (e.g., the first frame 297-1 of FIG. 2, the second frame 297-2 of FIG. 2, or the third frame 297-3 of FIG. 2), a first temple (e.g., the first temple 298-1 of FIG. 2) connected to one side of the frame, and a second temple (e.g., the second temple 298-2 of FIG. 2) connected to the other side of the frame, a first PCB (e.g., the first PCB 287-1 of FIG. 2, the first PCB 410 of FIG. 4, or the first PCB 750 of FIG. 7) positioned in the first temple, and a flexible printed circuit board electrically connected to the first PCB, in which the flexible printed circuit board (e.g., the flexible printed circuit board 500 of FIG. 5) may include a first rigid portion (e.g., the first rigid member 511 of FIG. 5) connected to the first PCB, a first flexible portion (e.g., the first flexible member 531 of FIG. 5) extending from the first rigid portion in a first direction (e.g., the first direction Dr1 of FIG. 5), and a second flexible portion (e.g., the second flexible member 532 of FIG. 5) extending from the first rigid portion in a second direction (e.g., the second direction Dr2 of FIG. 5) different from the first direction, the second flexible portion being bent in a bending area (BA1) to overlap at least a portion of the first flexible portion.

According to various example embodiments, the flexible printed circuit board may further include a third flexible portion (e.g., the third flexible member 533 of FIG. 5) extending from the first rigid portion in a third direction (e.g., the third direction Dr3 of FIG. 5), and the third flexible portion may be bent in a second bending area (BA2) and curved in a curving area (e.g., the first curve area CA1 of FIG. 5) to overlap at least a portion of the first flexible portion and at least a portion of the second flexible portion.

According to various example embodiments, the flexible printed circuit board may include an overlapping area (e.g., the overlapping area OA of FIG. 5) in which all of the first flexible portion, the second flexible portion, and the third flexible portion overlap each other and extend in one direction, and the overlapping area may be positioned in the first temple.

According to various example embodiments, the electronic device may further include a hinge (e.g., the first hinge portion 299-1 of FIG. 2) connecting the frame and the first temple to each other, and the overlapping area of the flexible printed circuit board may overlap the hinge.

According to various example embodiments, each of the first flexible portion, the second flexible portion, and the third flexible portion may be connected to different components (e.g., the components of FIG. 4).

According to various example embodiments, the electronic device may further include a second PCB (e.g., the second PCB 287-2 of FIG. 2, the second PCB 420 of FIG. 4, or the second PCB 760 of FIG. 7) positioned in the second temple, wherein any one of the first flexible portion, the second flexible portion, and the third flexible portion may extend to the second temple to be electrically connected to the second PCB.

According to various example embodiments, the frame may include a first frame (e.g., 297-1) connected to the first temple, a second frame (e.g., 297-2) connected to the second temple, and a bridge (e.g., the bridge 297-3 of FIG. 2) connecting the first frame with the second frame, and at least one of the first flexible portion, the second flexible portion, and third flexible portion may extend along the first temple, at least a portion of the first frame, and the bridge and may be connected to at least one electrical component positioned in the second frame or the second temple.

According to various example embodiments, the electronic device may further include a camera (e.g., the first camera 280-1, the second camera 280-2, and/or the third camera 280-3 of FIG. 2) and a display (e.g., the first display 261-1 and the second display 261-2 of FIG. 2) positioned in one area of the frame, and one of the first flexible portion and the second flexible portion may be connected to the camera and the other of the first or second flexible members may be connected to the display.

According to various example embodiments, the electronic device may further include a first transparent plate (e.g., the first transparent member 296-1 of FIG. 2) and a second transparent plate (e.g., the second transparent member 296-2 of FIG. 2), wherein the frame may include a first frame connected to the first temple and fixing the first transparent plate and a second frame connected to the second temple and fixing the second transparent plate, and the display may be configured to display a screen through a screen output area (e.g., the first screen output area 260-1 and/or the second screen output area 260-2 of FIG. 2) positioned on at least one of the first transparent plate and the second transparent plate.

According to various example embodiments, at least one of the first flexible portion, the second flexible portion, and the third flexible portion may extend from the overlapping area along the frame.

According to various example embodiments, the flexible printed circuit board may include a connector (e.g., the first connector 521 of FIG. 5) positioned on the first rigid portion, the first PCB may include a contact portion (e.g., the contact portion 810 of FIG. 8) contacting the connector, and the first PCB and the flexible printed circuit board may be electrically connected through the connector.

According to various example embodiments, the first PCB and the flexible printed circuit board may be connected by hot bar bonding.

According to various example embodiments, the electronic device may further include an interposer (e.g., the interposer 1260 of FIG. 12) positioned between the first PCB and the first rigid portion of the flexible printed circuit board, wherein the first PCB and the flexible printed circuit board may be electrically connected through the interposer.

According to various example embodiments, the electronic device may further include a second rigid portion (e.g., the second rigid member 512 of FIG. 5) connected to an end of the first flexible portion, a third rigid portion (e.g., the third rigid portion 513 of FIG. 5) connected to an end of the second flexible portion, a first connector (e.g., the first connector 521 of FIG. 5) positioned on the first rigid portion and connected to the first PCB, a second connector (e.g., the second connector 522 of FIG. 5) positioned on the second rigid portion and connected to a component of the electronic device, and a third connector (e.g., the third connector 523 of FIG. 5) positioned on the third rigid portion and connected to a different component of the electronic device.

According to various example embodiments, the second flexible portion may be bent in the first bending area to overlap at least a portion of the first rigid portion.

A flexible printed circuit board (e.g., the flexible printed circuit board 500 of FIG. 5) according to various example embodiments may include: a first rigid portion (e.g., the first rigid portion 511 of FIG. 5), a first flexible portion (e.g., the first flexible portion 531 of FIG. 5) extending from the first rigid portion in a first direction (e.g., the first direction Dr1 of FIG. 5), and a second flexible portion (e.g., the second flexible portion 532 of FIG. 5) extending from the first rigid portion in a second direction (e.g., the second direction Dr2 of FIG. 5) different from the first direction, the second flexible portion being bent in a first bending area (e.g., the first bending area BA1 of FIG. 5) to overlap at least a portion of the first flexible portion.

According to various example embodiments, the flexible printed circuit board may further include a third flexible portion (e.g., the third flexible portion 533 of FIG. 5) extending from the first rigid portion in a third direction (e.g., the third direction Dr3 of FIG. 5), and the third flexible portion may be bent in a second bending area (e.g., the second bending area BA2 of FIG. 5) and curved in a curving area (e.g., the first curve area CA1 of FIG. 5) to overlap at least a portion of the first flexible portion and at least a portion of the second flexible portion.

According to various example embodiments, the flexible printed circuit board may further include an overlapping area (OA) in which all of the first flexible portion, the second flexible portion, and the third flexible portion overlap each other and extend in one direction.

According to various example embodiments, the flexible printed circuit board may further include a second rigid portion (e.g., the second rigid member 512 of FIG. 5) connected to an end of the first flexible portion, a third rigid portion (e.g., the third rigid member 513 of FIG. 5) connected to an end of the second flexible portion, a first connector (e.g., the first connector 521 of FIG. 5) positioned on the first rigid portion, a second connector (e.g., the second connector 522 of FIG. 5) positioned on the second rigid portion, and a third connector (e.g., the third connector 523 of FIG. 5) positioned on the third rigid portion.

According to various example embodiments, the second flexible portion may be bent in the first bending area to overlap at least a portion of the first rigid portion.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the present disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspects (e.g., importance or order). It is to be understood that if an element (e.g., a first element) is referred to, with or without the term "operatively" or "communicatively," as "coupled with," "coupled to," "connected with," or "connected to" another element (e.g., a second element), the element may be coupled with the other element directly (e.g., wiredly), wirelessly, or via a third element.

As used in various embodiments of the present disclosure, the term "module" may include a unit implemented in hardware, software, or firmware, or any combination thereof, and may interchangeably be used with other terms, for example, "logic," "logic block," "part," "circuitry," or the like. A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the plurality of entities may be disposed separately from other components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
   a housing including a frame, a first temple connected to one side of the frame, and a second temple connected to the other side of the frame;
   a first printed circuit board (PCB) positioned in the first temple; and a flexible printed circuit board electrically connected to the first PCB,
wherein the flexible printed circuit board includes:
a first rigid portion connected to the first PCB;
a first flexible portion extending from a first side of the first rigid portion in a first direction;
a second flexible portion extending from a second side of the first rigid portion in a second direction different from the first direction, the second flexible portion being bent in a first bending area to overlap at least a portion of the first flexible portion; and
a third flexible portion extending from a third side of the first rigid portion in a third direction different from the first and second directions, the third flexible portion being bent in a second bending area and curved in a curving area to overlap at least a portion of the first flexible portion and at least a portion of the second flexible portion, wherein the third direction is opposite to the first direction,
wherein the first flexible portion extends from the first rigid portion in the first direction without overlapping the first rigid portion.

2. The electronic device of claim 1, further comprising:
a second rigid portion connected to an end of the first flexible portion;
a third rigid portion connected to an end of the second flexible portion; and
a fourth rigid portion connected to an end of the third flexible portion,
wherein the first, second and third rigid portions are displayed from each other in the first direction and are provided on different planes.

3. The electronic device of claim 2, wherein each of the first flexible portion, the second flexible portion, and the third flexible portion are connected to different components.

4. The electronic device of claim 3, further comprising a second PCB positioned in the second temple,
wherein any one of the first flexible portion, the second flexible portion, and the third flexible portion extends to the second temple to be electrically connected to the second PCB.

5. The electronic device of claim 3, wherein the frame includes:
a first frame connected to the first temple;
a second frame connected to the second temple; and
a bridge connecting the first frame with the second frame, and
at least one of the first flexible portion, the second flexible portion, and third flexible portion extends along the first temple, at least a portion of the first frame, and the bridge, and is connected to at least one electrical component positioned in the second frame or the second temple.

6. The electronic device of claim 1, wherein the flexible printed circuit board includes an overlapping area in which all of the first flexible portion, the second flexible portion, and the third flexible portion overlap each other and extend in one direction, and
the overlapping area is positioned in the first temple.

7. The electronic device of claim 6, further comprising a hinge connecting the frame and the first temple to each other,
wherein the overlapping area of the flexible printed circuit board overlaps the hinge.

8. The electronic device of claim 6, wherein at least one of the first flexible portion, the second flexible portion, and the third flexible portion extends from the overlapping area along the frame.

9. The electronic device of claim 1, further comprising a camera and a display positioned in an area of the frame, and
one of the first flexible portion and the second flexible portion is connected to the camera and the other of the first flexible portion and the second flexible portion is connected to the display.

10. The electronic device of claim 9, further comprising a first transparent member comprising a transparent plate and a second transparent member comprising a transparent plate,
wherein the frame includes:
a first frame connected to the first temple and fixing the first transparent member; and
a second frame connected to the second temple and fixing the second transparent member, and
the display is configured to display a screen through a screen output area positioned on at least one of the first transparent member and the second transparent member.

11. The electronic device of claim 1, wherein the flexible printed circuit board includes a connector positioned on the first rigid portion,
the first PCB includes a contact portion contacting the connector, and
the first PCB and the flexible printed circuit board are electrically connected through the connector.

12. The electronic device of claim 1, wherein the first PCB and the flexible printed circuit board are connected by hot bar bonding.

13. The electronic device of claim 1, further comprising an interposer positioned between the first PCB and the first rigid portion of the flexible printed circuit board,
wherein the first PCB and the flexible printed circuit board are electrically connected through the interposer.

14. The electronic device of claim 1, further comprising:
a second rigid portion connected to an end of the first flexible portion;
a third rigid portion connected to an end of the second flexible portion;
a first connector positioned on the first rigid portion and connected to the first PCB;
a second connector positioned on the second rigid portion and connected to a component of the electronic device; and
a third connector positioned on the third rigid portion and connected to a different component of the electronic device.

15. The electronic device of claim 1, wherein the second flexible portion is bent in the first bending area to overlap at least a portion of the first rigid portion.

16. A flexible printed circuit board comprising:
a first rigid portion;
a first flexible portion extending from a first side of the first rigid portion in a first direction;
a second flexible portion extending from a second side of the first rigid portion in a second direction different from the first direction, and overlapping at least a portion of the first flexible portion by being bent in a first bending area; and
a third flexible portion extending from a third side of the first rigid portion in a third direction different from the first and second directions, the third flexible portion being bent in a second bending area and curved in a curving area to overlap at least a portion of the first flexible portion and at least a portion of the second flexible portion, wherein the third direction is opposite to the first direction, wherein the first flexible portion extends from the first rigid portion in the first direction without overlapping the first rigid portion.

17. The flexible printed circuit board of claim 16, further comprising:
a second rigid portion connected to an end of the first flexible portion;
a third rigid portion connected to an end of the second flexible portion; and
a fourth rigid portion connected to an end of the third flexible portion,
wherein the first, second and third rigid portions are displayed from each other in the first direction and are provided on different planes.

18. The flexible printed circuit board of claim 16, further comprising an overlapping area in which all of the first flexible portion, the second flexible portion, and the third flexible portion overlap each other and extend in one direction.

19. The flexible printed circuit board of claim 16, further comprising:
a second rigid portion connected to an end of the first flexible portion;
a third rigid portion connected to an end of the second flexible portion;
a first connector positioned on the first rigid portion;
a second connector positioned on the second rigid portion; and
a third connector positioned on the third rigid portion.

20. The flexible printed circuit board of claim 16, wherein the second flexible portion is bent in the first bending area to overlap at least a portion of the first rigid portion.

* * * * *